US006596076B1

(12) United States Patent
Wakayama

(10) Patent No.: US 6,596,076 B1
(45) Date of Patent: Jul. 22, 2003

(54) APPARATUS AND METHOD FOR ALTERING THE APPARENT EFFECTS OF GRAVITY

(75) Inventor: Nobuko Wakayama, No. 931-2, 19-2, Azuma 3-chome, Tsukuba-shi, Ibaraki-ken (JP)

(73) Assignees: Director-General of Agency of Industrial Science and Technology, Tokyo (JP); Nobuko Wakayama, Tokyo (JP)

( * ) Notice: Subject to any disclaimer, the term of this patent is extended or adjusted under 35 U.S.C. 154(b) by 0 days.

(21) Appl. No.: 09/107,477

(22) Filed: Jun. 30, 1998

(51) Int. Cl.[7] ................................................ C30B 7/00
(52) U.S. Cl. ......................... 117/68; 117/31; 117/901; 117/200; 361/143; 310/90.5; 318/683
(58) Field of Search ...................... 310/90.5; 318/683; 117/901, 31; 361/143

(56) References Cited

U.S. PATENT DOCUMENTS

| 2,856,238 A | * | 10/1958 | Dacus | 308/10 |
|---|---|---|---|---|
| 2,856,239 A | * | 10/1958 | Dacus | 308/10 |
| 2,856,240 A | * | 10/1958 | Breazeale et al. | 308/10 |
| 2,904,411 A | * | 9/1959 | Pfann | 117/901 |
| 3,090,239 A | * | 5/1963 | Dacus | 73/517 |
| 3,232,745 A | * | 2/1966 | Rummel et al. | 117/901 |
| 3,705,789 A | * | 12/1972 | Keller | 117/901 |
| 5,168,096 A | * | 12/1992 | Tournier | 505/1 |
| 5,218,257 A | * | 6/1993 | Tozoni | 310/90.5 |
| 5,733,458 A | * | 3/1998 | Kitazawa et al. | 210/69.5 |
| 5,858,084 A | * | 1/1999 | Lee et al. | 117/32 |
| 5,899,220 A | * | 5/1999 | Alcocer et al. | 137/13 |
| 5,985,153 A | * | 11/1999 | Dolan et al. | 210/69.5 |

FOREIGN PATENT DOCUMENTS

| JP | A 463104 | 5/1992 |
|---|---|---|
| JP | A 7307221 | 11/1995 |

OTHER PUBLICATIONS

Pfann et al, "Electromagnetic Suspension of Molten Zone", Journal of Applied Physics vol. 27 No. 1 Jan. 1956 p. 12–18.*
Wakayama et al., *Journal of Crystal Growth*, 178, pp. 653–656 (1997).
*Nature*, vol. 349, p. 470 (1991).
*The Japan Society of Microgravity Application*, vol. 14, Supplement (1997).

* cited by examiner

*Primary Examiner*—Robert Kunemund
(74) *Attorney, Agent, or Firm*—Birch, Stewart, Kolasch & Birch, LLP

(57) ABSTRACT

There is disclosed an apparatus and method that appear to alter the effects of gravity by generating a magnetic field that causes an upward/downward magnetic force to act on a substance in a container. This offsets or adds to the downward force of gravity, to simulate a low-gravitational or excess-gravitational environment inside the substance.

28 Claims, 3 Drawing Sheets

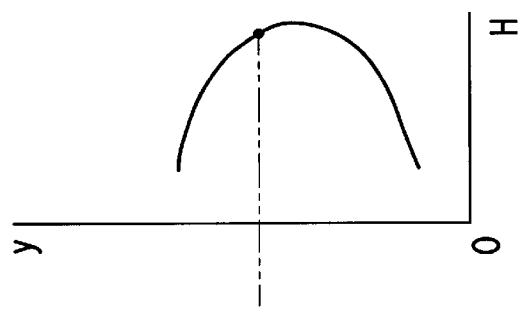
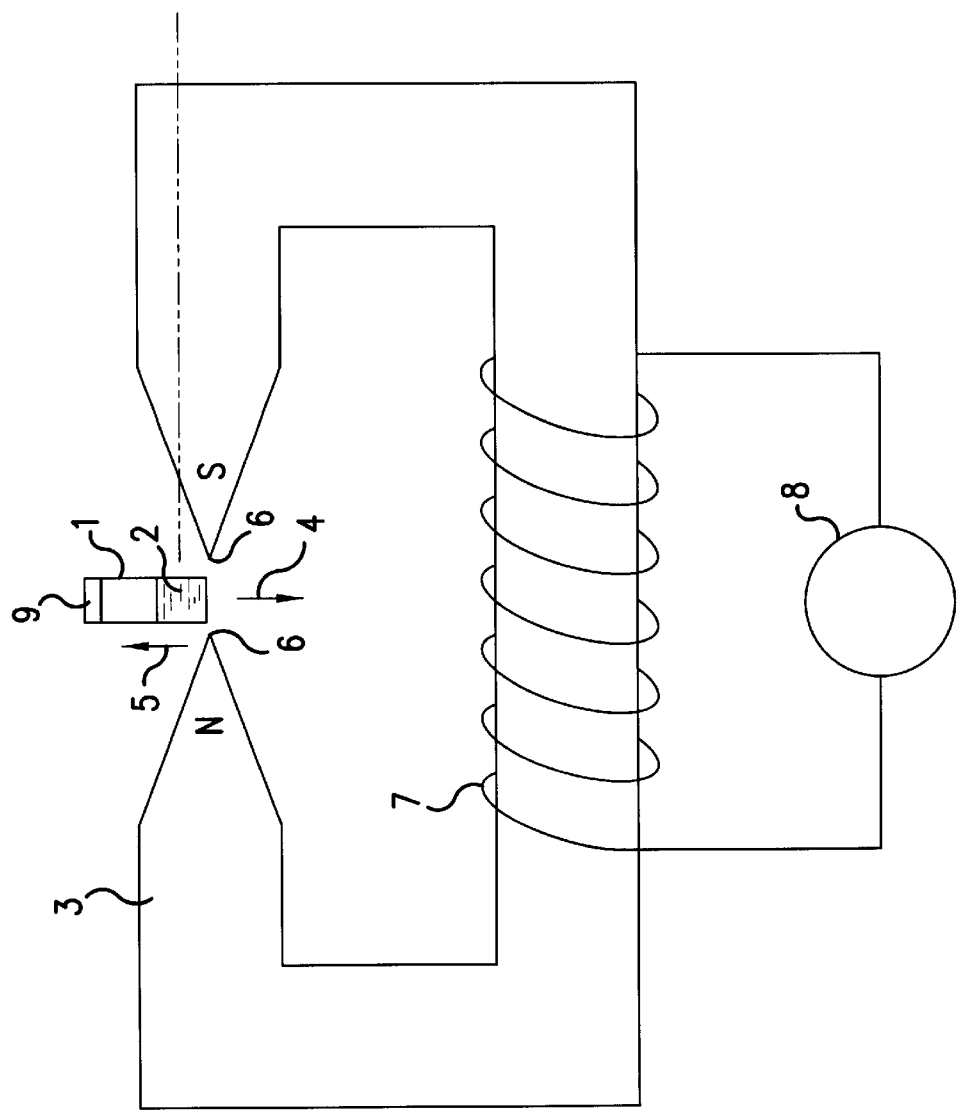
FIG.1B
FIG.1A

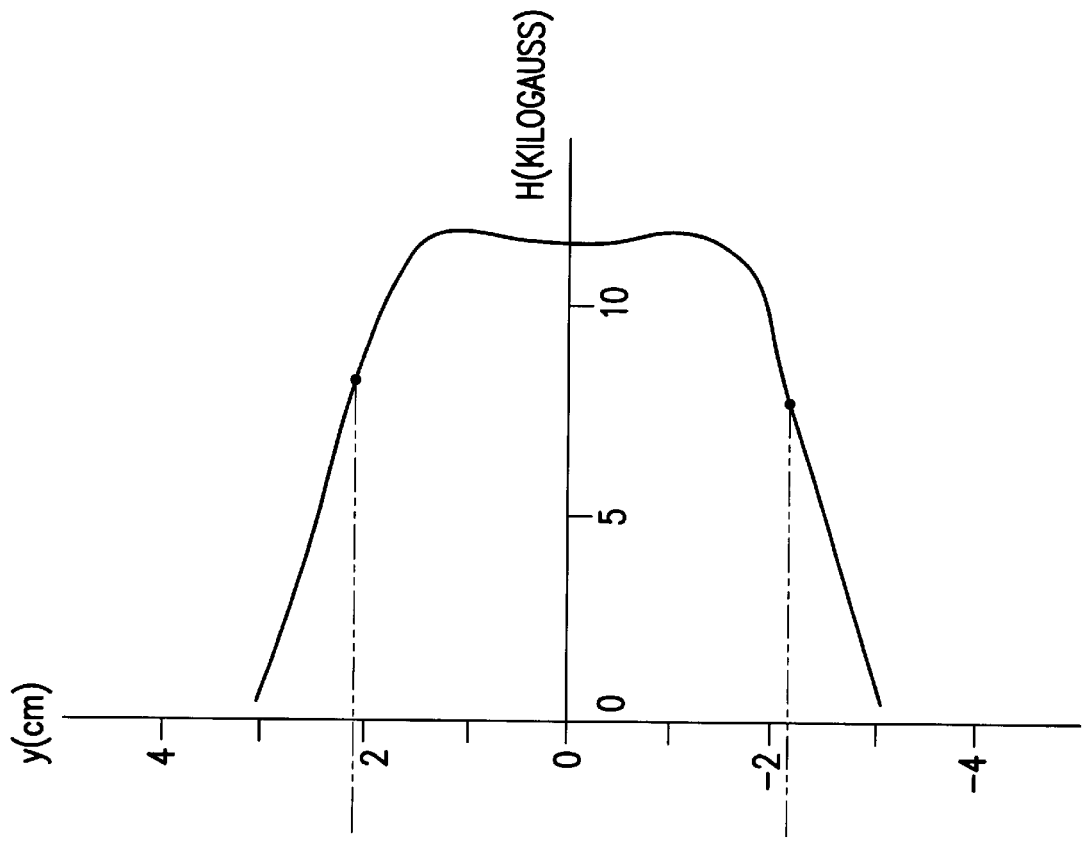
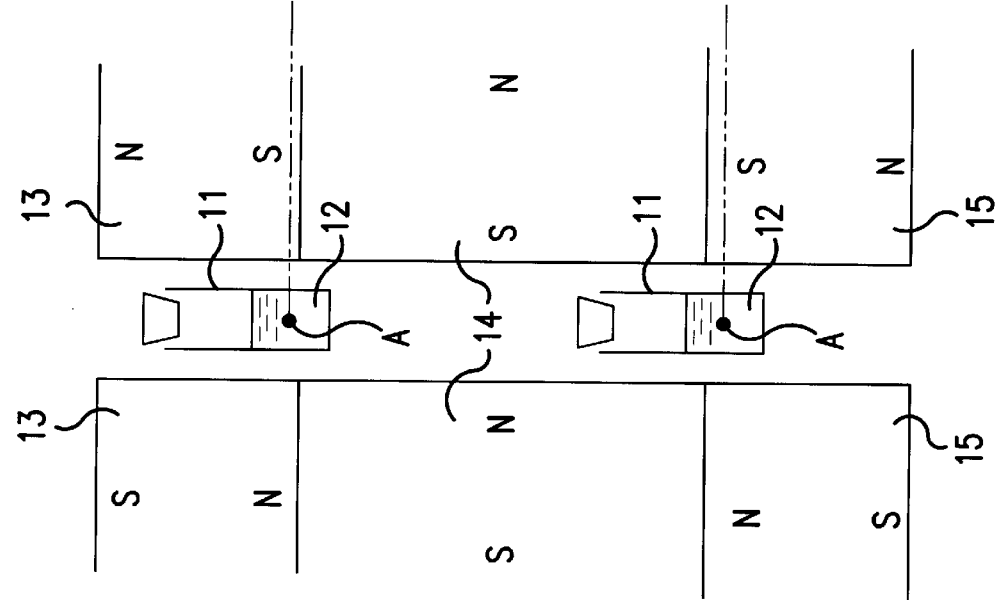
FIG.3B
FIG.3A

APPARATUS AND METHOD FOR ALTERING THE APPARENT EFFECTS OF GRAVITY

FIELD OF THE INVENTION

The present invention relates to an apparatus and a method for altering the apparent effects or using a magnetic force. More particularly, the present invention relates to an apparatus and a method that can simulate a low gravitational enviroment or an excess-gravitational environment in a localized region such as a small container, by using a gradient magnetic field to offset or add the vertical magnetic force to the force of gravity on the medium inside the container.

BACKGROUND OF THE INVENTION

Chemical reactions, the formation of crystals, and the like that are carried out on the earth (ground) cannot avoid the influence of convection, buoyancy, and the like that is caused by a gravitational field. On the other hand, the development and study of new materials, new drugs, and the like that are obtained, for example, by carrying out synthesis in a microgravitational field, where these influences are less, are attracting attention. For example, the crystallization of macromolecules of a biological substance is difficult in the normal gravitational field due to convection or sedimentation, but it is known that a high-quality single crystal essential to X-ray structure analysis is obtained in a microgravitational environment. The study of new materials, such as materials for contact lenses high in oxygen permeability, and zeolites high in catalytic performance, using microgravitational environments is under way.

Presently, as means of forming such microgravitational environments, there is the use of space shuttles, as is well known, and various experiments are carried out using the microgravitational environment in space shuttles, but the cost is enormous. Moreover, there is no apparatus that can simulate continuously from a microgravitational environment to the normal gravitational field. In addition to the use of space shuttles, it is conceivable to use, for example, a drop tower that simulates a gravity-free state in a capsule that is allowed to fall freely, and an airplane in parabolic flight, but, for example, any of these requires very large facilities and apparatus and enormous costs, and the period during which the simulated microgravity can be retained is about 30 sec at most, which is one of causes that prevent the development of study and mass production of developed new materials and the like. Further, in these methods, it is impossible to change the simulated gravitational environment to an arbitrary level, and it is difficult to simulate a gravitational environment to meet the purpose.

Under these circumstances, it is desired to have an apparatus and a method of simulating an arbitrary gravitational enviroment that are suitable for use in the usual investigation environment and in a production system in factories.

SUMMARY OF THE INVENTION

An object of the present invention is to provide an apparatus that can simulate a low-gravitational environment or an excess-gravitational environment for a localized region occupied by a medium in ordinary laboratories and factories, having no need of large apparatuses. Further, another object of the present invention is to provide an apparatus that can variably simulate desired gravitational environment in a substance from a microgravity to an excess-gravity, to meet the purpose of use.

Furthermore, still another object of the present invention is to provide a method of variably simulating a gravitational environment in a substance in a container in laboratories and factories without using large apparatuses and facilities.

Other and further objects, features, and advantages of the invention will appear more fully from the following description, taken in connection with the accompanying drawings.

BRIEF DESCRIPTION OF THE DRAWINGS

FIG. 1A is an illustrative view showing an embodiment of the present invention, and FIG. 1B is a graph showing the relationship between the strength of the magnetic field formed in FIG. 1A and the vertical positional coordinate.

FIG. 3A is an illustrative view showing the arrangement of the positions of the magnets and the containers in Examples 1 and 2, and FIG. 3B is a graph showing the relationship between the strength of the magnetic field formed in FIG. 3A and the vertical positional coordinate.

DETAILED DESCRIPTION OF THE INVENTION

Figure 2A:
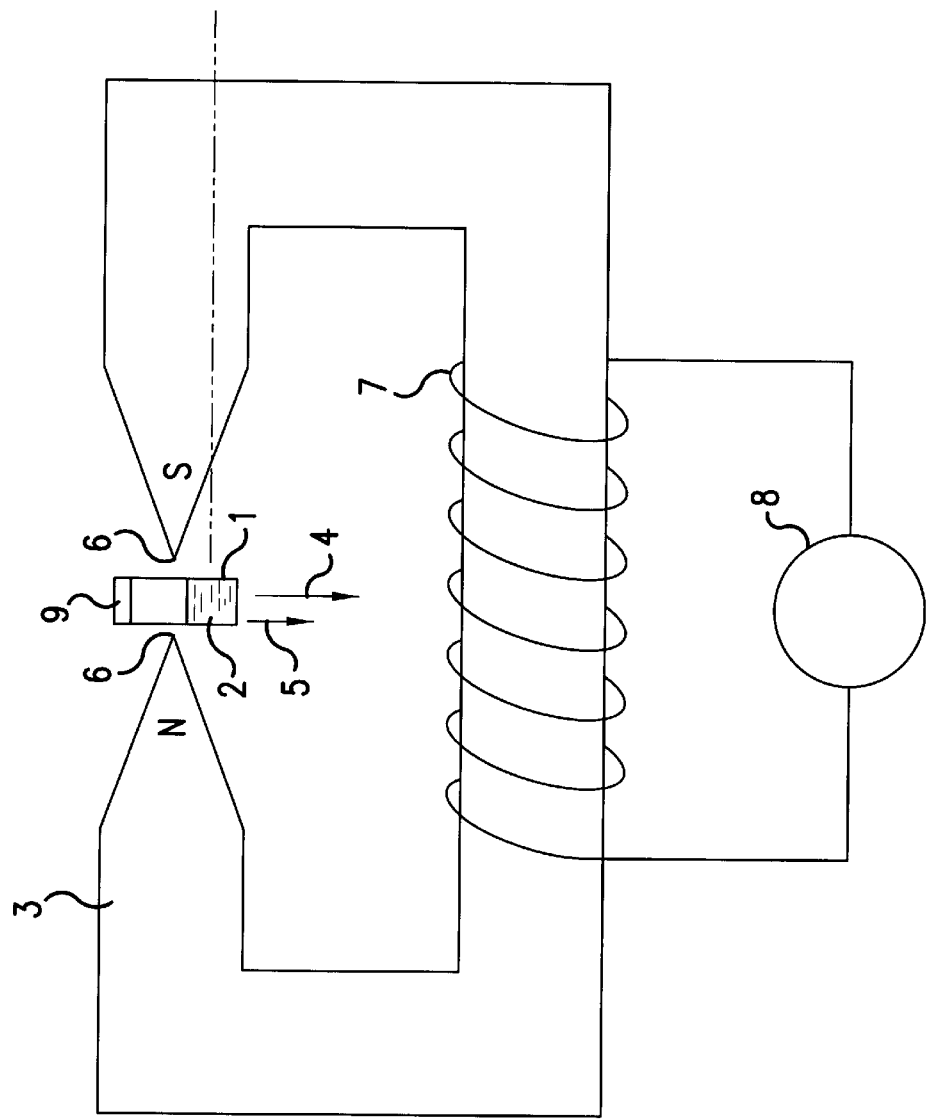
FIG. 2A is an illustrative view showing an embodiment of the present invention.

The inventor of the present invention, having investigated intensively in view of the above objects, has found that, when a magnetic force is allowed to act on a medium (liquid) in a container in the direction opposite to the direction of gravity or in the same direction as gravity by using a gradient-magnetic-field-generating apparatus, the medium experiences an altered downward acceleration that simulates a low-gravitational environment or an excess-gravitational environment. Based on this finding, the inventor has completed the present invention.

Namely, according to the present invention there are provided:

(1) An apparatus that appears to alter the effects of gravity, comprising a gradient-magnetic-field-generating apparatus, for causing an upward force by the magnetic field to act on a substance in a container, thereby offsetting downward gravity to give the appearance of a low-gravitational environment in the substance;

(2) The gravity-controlling apparatus as stated in the above (1), wherein, in the gradient-magnetic-field-generating apparatus, the value of the product of the magnetic field gradient and the magnetic field strength of the gradient magnetic field is made variable, to control the magnetic force acting on the substance in the container;

(3) The gravity-controlling apparatus as stated in the above (1), wherein, in the gradient-magnetic-field-generating apparatus, the value of the product of the magnetic field gradient and the magnetic field strength of the gradient magnetic field is uniform spatially;

(4) An apparatus that appears to alter the effects of gravity, comprising a gradient-magnetic-field-generating apparatus, for causing a downward force by the magnetic field to act on a substance in a container, thereby adding the downward force to downward gravity, to give the appearance of an excess-gravitational environment in the substance;

(5) The gravity-controlling apparatus as stated in the above (4), wherein, in the gradient-magnetic-field-generating apparatus, the value of the product of the magnetic field gradient and the magnetic field strength of the gradient magnetic field is made variable, to control the magnetic force acting on the substance in the container;

(6) The gravity-controlling apparatus as stated in the above (4), wherein, in the gradient-magnetic-field-generating apparatus, the value of the product of the magnetic field gradient and the magnetic field strength of the gradient magnetic field is uniform spatially;

(7) An apparatus that appears to alter the effects of gravity, comprising a gradient-magnetic-field-generating apparatus, for causing an upward force by the magnetic field to act on a substance, so as to counterbalance gravity and give the appearance of substantially zero gravity in the substance;

(8) A method for apparently altering the effects of gravity, comprising generating a gradient magnetic field that causes an upward or downward force by the magnetic field to act on a substance in a container, and adding the force to downward gravity, to give the appearance of a low-gravitational or excess-gravitational environment in the substance;

(9) The method of controlling gravity as stated in the above (8), wherein the value of the product of the magnetic field gradient and the magnetic field strength of the gradient magnetic field is made variable, in order to control the magnetic force acting on the substance in the container;

(10) The method of controlling gravity as stated in the above (8), wherein the value of the product of the magnetic field gradient and the magnetic field strength of the gradient magnetic field is uniform spatially; and

(11) A method of appearing to alter the effects of gravity, comprising generating a gradient magnetic field that causes an upward force by the magnetic field to act on a substance, which counterbalances downward gravity on the substance, to give the appearance of an environment of substantially zero gravity in the substance.

In the present invention, "the gradient magnetic field" means the magnetic field wherein, in the space where a substance is present in the intended gravitational environment, the magnetic field strength is varied perpendicularly (vertically), and preferably it is a magnetic field in which the magnetic field strength is monotonously increased or decreased. Further, preferably the magnetic field strength is not varied horizontally.

In the present invention, an upward force or a downward force is caused to act on a substance by a gradient magnetic field, and the force is offset by or added to downward gravity, to give rise to the appearance of or simulation of a low-gravitational environment or an excess-gravitational environment in the substance.

In passing, in this specification or the claims, the low-gravitational field simulated by the present invention includes the so-called microgravitational field and the zero-gravity field.

Hereinbelow, the present invention is described.

Preferable embodiments of the apparatus, and the corresponding method according to the invention are described in detail based on the drawings.

FIG. 1 is an illustrative view showing an embodiment of the present invention. FIG. 1A is a front view of the apparatus for reducing apparent gravity acting on a diamagnetic substance 2 in a container 1, and FIG. 1B is a graph showing the gradient magnetic field formed by a magnet 3 [the horizontal axis: the magnetic field strength (H); the vertical axis: the vertical coordinate (y) in the same positional coordinate as in FIG. 1A]. The upper space section of the container 1 containing the substance 2 is occupied by air and is closed with a lid 9. The container 1 is fixed and held in a specific place by a given fixing/holding structure (not shown). In the figure, 1 indicates the container holding the substance 2, 3 indicates a electromagnet for causing an upward force by a magnetic field to act on the inside of the container 1; and the pair of the ends 6, 6 of the magnetic poles are positioned near and opposite to the lower part of the container 1. In the figure, 7 indicates a coil of the electromagnet, and 8 indicates a direct-current power supply. In this case, as shown in FIG. 1B, the substance 2 in the container 1 is in a gradient magnetic field. The magnetic strength (H) decreases as the vertical coordinate (y) increases and the upward magnetic force on the substance 2 is generated. A gravitational force of $F_G = \rho \times g$ ($\rho$ represents the density and g represents the gravitational acceleration) per unit volume acts on the diamagnetic substance 2 in the direction of the downward arrow 4. On the other hand, the magnetic force $F_H$ acts in the direction of the upward arrow 5, to offset the gravity, so that the force F acting on the substance 2 is represented by $F = F_G - F_H$, and therefore the effect of gravity is offset, creating the appearance that gravity is reduced. Accordingly, a seemingly low-gravitational environment is created in the substance 2. The term "in the substance 2" refers to the region occupied by the substance 2 (for example, if water is held in the container, it refers to the region occupied by the water in the container).

Figure 2B:
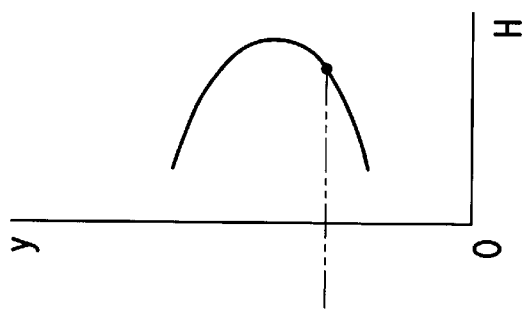
FIG. 2B is a graph showing the relationship between the strength of the magnetic field formed in FIG. 2A and the vertical positional coordinate.

Similarly to FIG. 1, FIG. 2 shows an embodiment of a seemingly enhancing gravity apparatus, and a method of seeming to enhance the force of gravity on a diamagnetic substance 2. In FIG. 2, the same symbols as in FIG. 1 indicate the same things as in FIG. 1. As is shown in FIG. 2B, the substance 2 in the container in FIG. 2A is in a gradient magnetic field. The magnetic field strength (H) increases as the vertical coordinate (y) increases, and therefore the direction of the arrow 5 of the magnetic force $F_H$ is directed downward, contrary to the case in FIG. 1A. The force F acting on the substance 2 in FIG. 2A is represented by $F = F_G + F_H$. The effect of gravity is combined with another downward force, i.e., a magnetic force. Therefore, this creates the appearance that the gravity inside the substance 2 is increased.

The above is the case when the substance 2 in the container is diamagnetic. When the substance 2 is paramagnetic, the direction of the arrow 5 of the magnetic force $F_H$ is reversed. For a paramagnetic substance 2, the gravity in FIG. 1A appears to be increased, while in FIG. 2A a decrease in gravity is appears to be brought about.

A space shuttle in outer space does not fall because gravity and centrifugal force are in balance. The microgravitational environment therein is due to centrifugal force that offsets gravity, and in the present invention, a magnetic force is used in place of this centrifugal force. First, the magnetic force and the gradient magnetic field are described.

Under the gradient magnetic field according to the present invention, the magnetic force ($F_H$) acting on a substance per unit volume can be represented as the product of the volume magnetic susceptibility ($\chi$) of the substance, the magnetic field strength (H), and the magnetic field gradient (dH/dy) that is the differential value of the magnetic field strength with respect to the positional coordinate:

$$F_H = \chi H (H(dH/dy)) \tag{1}$$

In Table 1, values of the volume magnetic susceptibility $\chi$ of various substances at room temperature are shown. The volume magnetic susceptibility is a physical constant corresponding to the density in the gravitational field, and it is the product of the density (ρ) and the mass magnetic susceptibility ($\chi_g$) lost substances, except ferromagnetic materials, are classified as diamagnetic substances, and parts thereof are classified as paramagnetic substances. For example, since χ of the diamagnetic liquids in Table 1 is on the order of $10^{-7}$ and negative, according to formula (1), the magnetic force that acts on these liquids are in the direction in which the magnetic field strength is decreased. Therefore, when a gradient magnetic field in which the magnetic field strength is decreased upward is applied on these liquids, the magnetic force acts in the direction opposite to gravity, to offset gravity, and therefore create the appearance of a low-gravitational environment (<1 G).

In this case, the force acting on the substance is represented by the following formula (2):

$$F = F_G - F_H = \rho\{g - \chi_g \cdot H(dH/dy)\} = \rho \cdot p \cdot g \qquad (2)$$

$$p = 1 - (\chi_g/g) \cdot H(dH/dy)$$

In this formula, p represents the gravity level, and g represents the gravitational acceleration on the ground.

Even under a gradient magnetic field in which the product of the magnetic field strength and the magnetic field gradient is not uniform, an upward magnetic force is generated. In this case, although the magnetic force is not made uniform, when the sum of the magnetic force acting on the substance is in balance with gravity, a phenomenon in which a diamagnetic substance, such as water, floats has been observed (E. Beaugnon, R. Tournier, *Nature* 349, 470, 1991). However, to realize a uniform zero-gravity level inside a floated substance, as is apparent from formula (2), it is essential that H(dH/dy) be uniform spatially. Further, preferably the magnetic field strength is not varied horizontally.

Conversely, when a gradient magnetic field where the magnetic field strength is decreased downward is formed, a magnetic force acts in the same direction as gravity, to create the appearance of an excess-gravitational environment (>1 G). Since the magnetic force is proportional to H(dH/dy), the value of H(dH/dy) can be determined suitably in accordance with the value of the intended gravitational environment. The value of (dH/dy) is not particularly limited, but preferably it is 3 kilogausses/cm or more.

TABLE 1

The volume magnetic susceptibility, the density, and the mass magnetic susceptibility of various substances at room temperature

|  |  | *volume magnetic susceptibility per $cm^3$ | Density (g/$cm^3$) | *Mass magnetic susceptibility per g |
|---|---|---|---|---|
| Pure water | D** | $-7.16 \times 10^{-7}$ | 1.0 | $-7.16 \times 10^{-7}$ |
| Acetone | D | $-4.63 \times 10^{-7}$ | 0.78 | $-5.85 \times 10^{-7}$ |
| Benzene | D | $-5.18 \times 10^{-7}$ | 0.69 | $-7.02 \times 10^{-7}$ |
| Glycerin | D | $-4.63 \times 10^{-7}$ | 1.05 | $-6.18 \times 10^{-7}$ |
| NaCl | D | $-11.2 \times 10^{-7}$ | 2.17 | $-5.17 \times 10^{-7}$ |
| $MgCO_3$ | D | $-10.5 \times 10^{-7}$ | 2.71 | $-3.84 \times 10^{-7}$ |
| $CaCO_3$ | D | $-10.4 \times 10^{-7}$ | 2.71 | $-3.82 \times 10^{-7}$ |
| Urea | D | $-7.4 \times 10^{-7}$ | 1.32 | $-5.61 \times 10^{-7}$ |
| Naphthalene | D | $-6.23 \times 10^{-7}$ | 0.866 | $-7.19 \times 10^{-7}$ |
| Nitrogen gas | D | $-5.4 \times 10^{-10}$ | $1.25 \times 10^{-3}$ | $-4.3 \times 10^{-7}$ |
| Lysozyme | D | $-9.0 \times 10^{-7}$ | 1.2 | $-7.5 \times 10^{-7}$ |
| Oxygen gas | P*** | $+1.52 \times 10^{-7}$ | $1.43 \times 10^{-3}$ | $+1.062 \times 10^{-4}$ |

(Note)
* CGS unit
** D : diamagnetic substance
*** P : paramagnetic substance

The container used in the present invention serves as a casing, and it is not particularly limited if it is made of a material that does not shut off the magnetic field, and specifically, for example, a container of glass, plastic, brass, or stainless steel can be used. The structure for fixing/holding the container is one obvious Ace to those skilled in the art, and it may be any structure that can fix and hold the container in a given place without affecting the gradient magnetic field.

The substance whose gravitational environment appears to be controlled may be filled fully in the container, or it may be placed in the container with a space, and a gas, such as air, may be present in the space. If necessary, a lid may be placed on the container, and if not necessary the space is not closed by a lid, as in the case when there is air in the space.

The gradient magnetic field according to the present invention may be formed by using, for example, a permanent magnet, an electromagnet, a superconducting magnet, or a hybrid magnet formed by combining two types of magnets. The type of magnet can be suitably selected in accordance with the required magnetic field strength, the environment in which the apparatus is used, and the purpose as well. FIGS. 1A and 2A show a case in which an electromagnet is employed, wherein a magnetic field is generated by passing an electric current through a coil 7 from a direct-current power supply 8. By adjusting the distance between magnetic poles 6, the value of H(dH/dy) can be adjusted. Preferably the value of H(dH/dy) is made constant at any vertical position of the substance 2 present in the container 1. In the case of an electromagnet and a superconducting magnet, since H(dH/dy) can be changed continuously by the amount of electric current through the coil of the magnet, the magnetic force acting on the substance in the container can be adjusted, and thereby creating the appearance that the gravity level inside the substance can be varied continuously.

The product of the magnetic field strength and the magnetic field gradient, that is, the value of H(dH/dy), is suitably set by the value of the gravity of the intended gravitational environment and the volume magnetic susceptibility of the substance in the container. For example, when pure water is used as the substance in the container, the inside of the water takes on the appearance of being gravity-free when H(dH/dy) is about $-1,360$ kilogausses$^2$/cm, by calculating based on formula (1), wherein the volume magnetic susceptibility (χ) of water is $-0.72 \times 10^{-6}$. Further, to create the appearance of varying the gravity of the inside water from 0 to 1 G, it is enough to adjust the electric current to vary the value of H(dH/dy) from about $-1,360$ kilogausses$^2$/cm to 0 continuously. When the magnetic force is equal to gravity, the region occupied by the substance takes on the appearance of being a zerogravity environment, the substance floats, as in a space shuttle, and therefore a container is not required. In passing, in the present invention, "a seemingly low-gravitational environment or a seemingly excess-gravitational environment" means that the environment takes on the appearance of being subject to gravity lower or more excessive than the surrounding gravitational environment. On the ground it means that, the environment takes on the appearance of being subject to gravity lower or more excessive than the normal gravity (1 G), but it does not necessarily mean that the normal gravity is used as a reference. Further, as for simulating extent of the low gravity and simulating excess gravity, for example, in the case of a seemingly low-gravitational environment, it is not necessarily required to simulate zero gravity. For example, in the case of the formation of crystals, even in an environment with the gravity seemingly lowered by about 5%, the crystallization becomes remarkably different.

With respect to the substance that is held in the container and whose gravitational environment is seemingly varied by the present invention, either a paramagnetic or diamagnetic substance can be used. Preferably a liquid of a diamagnetic substance as a medium is used as a base, and another liquid, a solid, or a gas may be present therein. Further, a gas may be used as a base. As is shown in Table 1, most liquids are diamagnetic, and the gravity can seemingly be controlled by the apparatus of the present invention or the method of the present invention. Since the mass magnetic susceptibilities ($\chi_g$) of diamagnetic substances are approximately the same value, if, for example, a liquid and a solid, or a liquid and a gas, coexist, the gravity level (p) represented by formula (2) can seemingly be controlled, though it is an approximation. Further, even in the case of a mixture of several types of substances, the gravity level can seemingly be controlled, though it is an approximation. Moreover, since the mass magnetic susceptibility ($\chi_g$) of diamagnetic substances is independent of temperature, even if there is a temperature gradient, the gravity level appears to become uniform. Furthermore, when crystals are formed from a solution in a container, since the volume magnetic susceptibilities and the densities of the solution and the crystals existing together are different from each other, there will be a difference between the effect of the simulated gravity according to the present invention on the solution and that on the crystals. However, when there is the relation $\chi_L/\chi_C = \rho_L/\rho_C$, in which $\chi_L$ and $\chi_C$ represent the volume magnetic susceptibility of the solution and the volume magnetic susceptibility of the crystals, respectively, and $\rho_L$ and $\rho_C$ represent the density of the solution and the density of the crystals, respectively, the variation gravity seemingly created by the present invention can be controlled as if both the solution and the crystals were placed in the same seemingly low-gravitational or seemingly excess-gravitational field. Considering that the mass magnetic susceptibilities of diamagnetic substances are approximately constant, as is shown in Table 1, it appears that, in many cases, the condition $\chi_L/\chi_C = \rho_L/\rho_C$ exists approximately. Further, paramagnetic substances that can be mentioned are an aqueous solution of a paramagnetic salt, liquid oxygen, liquid air, oxygen and air (gas in either case), some molten metals, and the like.

According to the invention, the vertical acceleration acting on a substance in a container can be controlled to simulate any gravity, ranging from a microgravity to an excess gravity, and furthermore the apparatus and the method of the invention can change the simulated gravitational environment in substance in a container to a desired value, continuously. When gravity and the magnetic force are in balance, to realize a microgravitational environment, a container is not required in the present invention. Since the container in the present invention is used as a casing for holding a substance, such as a liquid, in a specific place, the substance may be held without any container if possible. Further, unlike the case using a drop tower or the like, the intended substance can be kept in a desired gravitational field for a prescribed period, easily. Particularly, the present invention can provide a reaction field corresponding to of a low gravity enviroment, where convection and sedimentation are restrained and that is different from the normal gravitational field, at a low cost in the environment of ordinary laboratories and factories, and the invention exhibits an excellent function and effect that makes it possible to develop or mass-produce new materials, new drugs, and the like at a low cost.

Now, the present invention is described in more detail, based on the examples.

EXAMPLES

Example 1

Permanent magnets that were designed to generate a steep magnetic field gradient (available under the trade name of Neomax, manufactured by Sumitomo Special Metals Co., Ltd.) were used and were arranged as shown in FIG. 3A, to constitute a permanent magnet consisting of magnets 13, 14, and 15, so that a gradient magnetic field as shown in the graph of FIG. 3B was formed.

At a point A between the magnetic poles, were arranged six containers 11 of pyrex glass, each containing 0.2 ml of a diamagnetic supersaturated aqueous solution of a protein 12, which contained 4% of lysozyme, an egg white protein, and 3% of NaCl, and the pH of the solution was adjusted to 4.6 by the addition of hydrochloric acid. As is shown in FIG. 3B, the point A was in a gradient magnetic field where the magnetic field strength was decreased upward, and H(dH/dy) near the point A was about −64 kilogausses$^2$/cm. According to formula (1), the magnetic force acting on the aqueous solution were about 46 dyne/cm$^3$, corresponding to about 5% of gravity.

The apparent gravity acting on the aqueous solution (the force acting downward) was about 0.95 G, based on $F = F_G - F_H$, and as was expected from the above formula (1), the aqueous solution could be placed in a simulated low-gravitational environment.

Example 2

At a point B in FIG. 3A, were arranged six containers 11 of pyrex glass, each containing 0.2 ml of the same aqueous solution 12, as in Example 1. The point B was in a gradient magnetic field where the magnetic field strength was decreased downward, as shown in FIG. 3B, and H(dH/dy) near the point B was about 64 kilogausses$^2$/cm. Similarly to Example 1, the apparent gravity acting on the aqueous solution was about 1.05 G, according to the relationship $F = F_G + F_H$, and as was expected from the above formula (1), the aqueous solution could be placed in a simulated excess-gravitational environment.

Test Example

After the protein supersaturated aqueous solutions in Examples 1 and 2 were placed in the simulated low-gravitational field or the simulated excess-gravitational field for 24 hours, the numbers of the crystals precipitated therefrom (each number being the sum of crystals in the six containers) were counted. For comparison, the numbers of crystals were counted for the same number of containers, each containing the same amount of the same aqueous solution, were placed for 24 hours without the gradient magnetic field. Further, a similar comparison was carried out for the precipitation of crystals from the aqueous solutions, each placed not in the gradient magnetic field but in a uniform magnetic field. The uniform magnetic field was formed by using a superconducting magnet (100 kilogausses) and electromagnets (6 kilogausses and 12 kilogausses).

The results are shown in Table 2. In Table 2, Nos. 1 to 3 are when the containers, each containing the aqueous solution, were arranged at the point A in FIG. 3A; Nos. 4 and 5 are when the containers were arranged at the point B; and Nos. 6, 7, and 8 are when the containers were arranged in uniform magnetic fields of 6 kilogausses, 12 kilogausses, and 100 kilogausses, respectively, with or without a magnetic field for comparison.

TABLE 2

| | Numbers of precipitated crystals | | | |
|---|---|---|---|---|
| No. | With a magnetic field | Without a magnetic field | Temperature (° C.) | Remarks |
| 1 | 18 | 24 | 21 | Example 1 |
| 2 | 6 | 26 | 22 | " |
| 3 | 122 | 146 | 17 | " |
| 4 | 14 | 1 | 21 | Example 2 |
| 5 | 10 | 7 | 20 | " |
| 6 | 60 | 56 | 18 | Uniform magnetic field |
| 7 | 59 | 59 | 18 | Uniform magnetic field |
| 8 | 80 | 82 | 18 | Uniform magnetic field |

As is apparent from the results in Table 2, the numbers of crystals when a gradient magnetic field was applied in Nos. 1 to 3 were smaller in comparison with the case without the magnetic field. It is considered that this was because a low-gravitational environment of 0.95 G was simulated in the gradient magnetic field, and convection and sedimentation of the crystals were suppressed. On the contrary, in Nos. 4 and 5, an excess-gravitational environment of 1.05 G was simulated, and the numbers of crystals were increased more when the gradient magnetic field was applied than when there was no magnetic field.

From the results shown in Table 2, it can be understood that the simulated gravitational environment for a solution in a container can be controlled according to the present invention, and simulated environment for the formation of crystals different from the surrounding gravitational field is formed.

In passing, the numbers of crystals in the case of Nos. 6 to 8, when a uniform magnetic field was applied, were substantially the same as when the magnetic field was not applied (the reason why the numbers of crystals are larger than those of Nos. 1 to 5 is that the quantities of the aqueous solution are different). This is because, in the uniform magnetic field, the magnetic field gradient is zero and a magnetic force is not generated.

From the results, it can be understood that a variable gravitational environment can be simulated by using a magnetic force generated by a gradient magnetic field.

Having described our invention as related to the present embodiments, it is our intention that the invention not be limited by any of the details of the description, unless otherwise specified, but rather be construed broadly within its spirit and scope as set out in the accompanying claims.

What I claim is:

1. An apparatus for simulating an altered gravitational environment in a localized region, said apparatus comprising:
    a container; and
    a magnet system arranged around said container to induce a magnetic gradient field for a fluid medium in said container such that a magnetic force parallel or antiparallel to said gravitational acceleration is generated on said medium in said container, said magnetic force offsetting or adding to the force of gravity on said medium so that an altered gravitational field is simulated, wherein said force parallel or antiparallel to said gravitational acceleration is generated without conducting electric current through the fluid medium.

2. The apparatus of claim 1, wherein said magnet system includes at least one of a permanent magnet, an electromagnet, a superconducting magnet or a hybrid magnet arranged around said container to induce the magnetic gradient field for the medium in said container.

3. The apparatus of claim 1, wherein said magnet system comprises the electromagnet or the superconducting magnet and an amount of electric current can be changed to alter a magnetic force acting on the medium in said container.

4. The apparatus of claim 1, wherein said medium is a liquid or a gas.

5. The apparatus of claim 1, wherein a product of a magnetic field strength (H) and a vertical gradient (dH/dy) thereof is held at the same magnitude at every position of said medium in said container.

6. The apparatus of claim 1, wherein said container can be removed when the magnetic force is upward and is equal to the force of gravity on said liquid medium.

7. A system for simulating an altered gravitational environment in a fluid medium, said system comprising:
    a container containing said medium; and
    a magnet system arranged around said container to induce a magnetic gradient field for said medium such that a magnetic force parallel or antiparallel to said gravitational acceleration is generated on said medium, said magnetic force offsetting or adding to the force of gravity on said medium so that an altered gravitational field is simulated, wherein said force parallel or antiparallel to said gravitational acceleration is generated without conducting electric current through the fluid medium.

8. The system of claim 7, wherein said magnet system includes at least one of a permanent magnet, an electromagnet, a superconducting magnet or a hybrid magnet arranged around said container to induce the magnetic field gradient for said medium in said container.

9. The system of claim 7, wherein said magnet system comprises the electromagnet or the superconducting magnet and an amount of electric current can be changed to alter a magnetic force acting on the medium.

10. The system of claim 7, wherein a product of the magnetic field strength (H) and a vertical gradient (dH/dy) thereof is held at the same magnitude at every position of said medium in said container.

11. The system of claim 7, wherein said container can be removed when the magnetic force is upward and is equal to the force of gravity on said liquid medium.

12. A method for simulating an altered gravitational environment in a localized region, said method comprising:
    providing a container; and
    inducing a magnetic gradient field for a fluid medium in said container such that a magnetic force parallel or antiparallel to said gravitational acceleration is generated on said medium in said container, said magnetic force offsetting or adding to the force of gravity on said fluid medium so that an altered gravitational field is simulated, wherein said force parallel or antiparallel to said gravitational acceleration is generated without conducting electric current through the fluid medium.

13. A method for simulating an altered gravitational environment in a fluid medium, said method comprising:
    providing a container containing said medium; and
    inducing a magnetic gradient field having a magnetic field strength varied in a vertical direction for said medium in said container such that a magnetic force parallel or antiparallel to gravitational acceleration is generated on said medium, said magnetic force offsetting for adding to the force of gravity on said medium so that an altered gravitational field is simulated, wherein said force parallel or antiparallel to said gravitational acceleration is generated without conducting electric current through the fluid medium.

14. The method of claim 13, wherein the medium is a liquid or a gas.

15. The method of claim 14, wherein a magnet system induces said magnetic gradient field in a manner that a product of the magnetic field strength (H) and a vertical gradient (dH/dy) thereof is held at the same magnitude at every position of said medium in said container.

16. The method of claim 13, wherein the medium is a liquid.

17. The method of claim 16, wherein said liquid contains a solid, a gas or another liquid.

18. The apparatus of claim 1, wherein said medium is a liquid and said liquid contains a solid, a gas or another liquid.

19. The apparatus of claim 11, wherein the simulated altered gravitational field suppresses at least one of gravity-induced convection and gravity-induced sedimentation in said medium.

20. The system of claim 17, wherein the simulated altered gravitational field suppresses at least one of gravity-induced convection and gravity-induced sedimentation in said medium.

21. The method of claim 12, wherein the simulated altered gravitational field -suppresses at least one of gravity-induced convection and gravity-induced sedimentation in said medium.

22. The method of claim 13, wherein the simulated altered gravitational field suppresses at least one of gravity-induced convection and gravity-induced sedimentation in said medium.

23. The apparatus of claim 1, wherein said magnetic gradient field has at least one of the following characteristics: monotonic vertical increase or decrease; and no horizontal variation.

24. The system of claim 7, wherein said magnetic gradient field has at least one of the following characteristics: monotonic vertical increase or decrease; and no horizontal variation.

25. The method of claim 12, wherein said magnetic gradient field has at least one of the following characteristics: monotonic vertical increase or decrease; and no horizontal variation.

26. The method of claim 13, wherein said magnetic gradient field has at least one of the following characteristics: monotonic vertical increase or decrease; and no horizontal variation.

27. The system of claim 12, wherein a product of a magnetic field strength (H) and a vertical gradient (dH/dy) thereof is held at the same magnitude at every position of said medium in said container.

28. The apparatus of claim 1, wherein the fluid medium is water and a protein solution.

* * * * *